United States Patent [19]

Okudaira et al.

[11] 4,330,384
[45] May 18, 1982

[54] PROCESS FOR PLASMA ETCHING

[75] Inventors: Sadayuki Okudaira; Keizo Suzuki; Shigeru Nishimatsu; Ichiro Kanomata, all of Kokubunji, Japan

[73] Assignee: Hitachi, Ltd., Tokyo, Japan

[21] Appl. No.: 89,093

[22] Filed: Oct. 29, 1979

[30] Foreign Application Priority Data

Oct. 27, 1978 [JP] Japan .................................. 53-131622
Dec. 1, 1978 [JP] Japan .................................. 53-164644

[51] Int. Cl.³ ........................... C23F 1/02; H05H 1/24
[52] U.S. Cl. ................................ 204/192 E; 204/298; 156/643
[58] Field of Search ................ 204/192 E, 192 EC; 156/643, 646; 219/121 PE

[56] References Cited

U.S. PATENT DOCUMENTS 4,101,411  7/1978  Suzuki et al. ...................... 204/298
4,138,306  2/1979  Niwa .................................. 156/345
4,175,235  11/1979 Niwa et al. ......................... 250/542

FOREIGN PATENT DOCUMENTS 51-27833  9/1976  Japan .................................. 156/643
53-33472  9/1978  Japan .................................. 156/643
1485063   9/1977  United Kingdom ................ 156/643

OTHER PUBLICATIONS

S. Ichimaru, *Basic Principles of Plasma Physics*, W. A. Benjamin, Inc., Reading, Massachusetts, 1973, Section 7.5A.
*Rikagakujiten* (Dictionary of Physics and Chemistry), 3rd Ed., 1971 p. 1323.
Y. Horbike and M. Shibagaki, Dry Etching Technology . . . ; Electrochem. Society-Semiconductor Silicon, p. 1071ff, 5/1977.

*Primary Examiner*—Delbert E. Gantz
*Assistant Examiner*—William Leader
*Attorney, Agent, or Firm*—Craig & Antonelli

[57] ABSTRACT

Micro-wave plasma etching is carried out with a gas containing at least $SF_6$ as an etching gas at a high etching rate of silicon, and a high selectivity, with an easy monitoring and a low temperature dependency.

28 Claims, 5 Drawing Figures

PROCESS FOR PLASMA ETCHING

BACKGROUND OF THE INVENTION

1. Field of the Invention

This invention relates to a process for plasma etching, and more particularly to a process for etching silicon or various silicon compounds by plasma etching.

2. Description of the Prior Art

In the production of various semi-conductor devices, the so-called "dry process" has been much used to make patterning or perforation of semi-conductor substrates, insulating films or semi-conductor films without using chemicals or water. That is, the so-called, conventional "wet process" using a large amount of various acids, alkalis, organic solvents or the like has many problems such as a large possibility of contamination by impurities contained in the chemicals; swelling of the resist film used as a mask, making the shape irregular, inevitable occurrences of undercut, etc.

In the field of integrated circuit production, a large effort has been recently made to improve the degree of integration, but it is necessary to make far finer wiring, perforation, or other processings more precisely than before to improve the degree of integration. The wet process, where the swelling of resist and undercut are inevitable, is naturally not suitable for such finer processings. The dry process using no such chemicals thus is preferable, and a dry process based on plasma etching is now most widely employed among the available dry processes.

Plasma etching is defined as a process of introducing a halogen compound such as $CF_4$, $CCl_4$, $BCl_3$, etc. or further admixed with $O_2$, $N_2$, Ar or air into a reactor tube under a specific pressure, generating a plasma within the reactor tube, and etching a material to be etched in the reactor tube by radicals formed by the plasma.

Various apparatuses are used for plasma etching, but a "planar type" apparatus comprises of two flat electrode plates placed parallel to each other in a reactor tube, and a "barrel type" apparatus comprised of semi-annular electrodes placed around the outside of a reactor tube against each other are most widely used, and a high frequency power such as 13.56 MHz is applied thereto as a power for generating plasma.

When the etching is carried out by means of these plasma etching apparatuses, the drawbacks of said conventional wet process can be much improved, and it is expected to use the process for plasma etching in the production of semi-conductor integrated circuits with a high degree of integration much more in the future. However, etching of silicon or silicon compounds, which undergo etching to the largest degree, still has problems to be solved in etching rate, selectivity, detection of etching end point, etc., and these problems have been difficult to solve.

SUMMARY OF THE INVENTION

An object of the present invention is to provide a process for plasma etching capable of etching silicon or silicon compounds at a high etching rate and a high selectivity and further capable of readily detecting an etching end point.

To attain this object, the present invention uses a plasma etching apparatus utilizing a micro-wave generated by a magnetron as the etching apparatus (the apparatus will be referred to herein as "micro-wave plasma etching apparatus"), where silicon or silicon compound is etched with a gas containing $SF_6$ as an atmosphere gas.

DETAILED DESCRIPTION OF PREFERRED EMBODIMENTS

Description will be made below, at first, of a micro-wave plasma etching apparatus to be used in the present invention.

As described above, either "planar type" or "barrel type" apparatus has been so far used as the plasma etching apparatus.

The micro-wave plasma etching apparatus has been proposed by one of the present inventors (Japanese Laid-open Patent Application No. 51-71597; U.S. Pat. No. 4,101,411), whose basic structure is schematically shown in FIG. 1.

Figure 1:
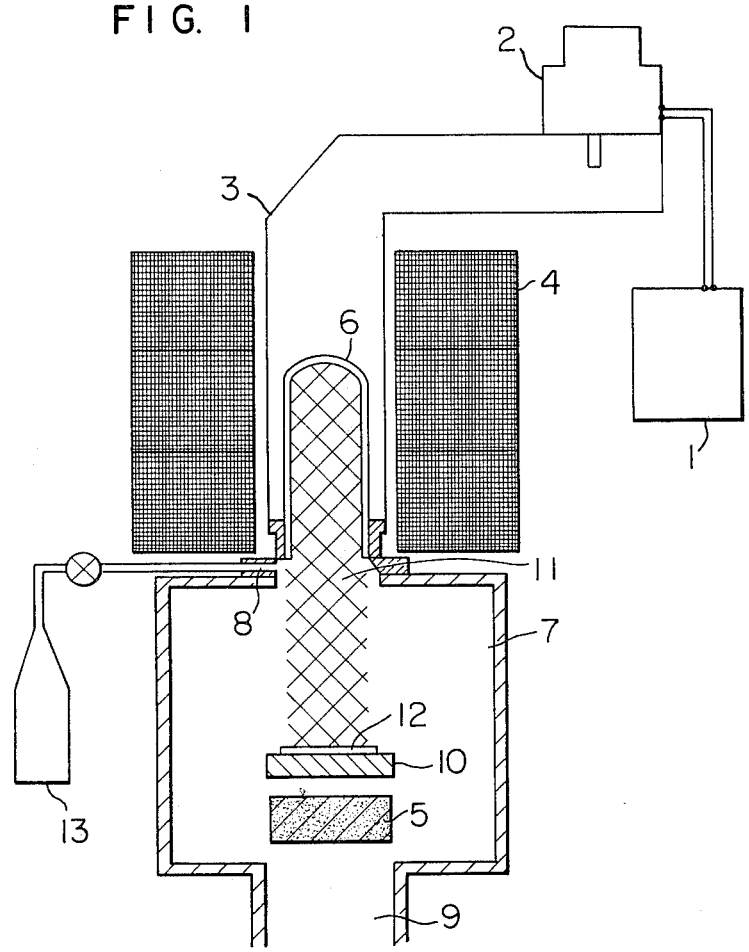
FIG. 1 is a schematic view showing a basic structure of a micro-wave plasma etching apparatus to be used in the present invention.

In FIG. 1, a micro-wave generated at a magnetron 2 by a micro-wave generating power source 1 is propagated through a waveguide 3 and absorbed into an etching gas controlled to less than 13 Pa in a discharge tube 6 made from an insulating material and placed in a mirror magnetic field formed by a magnetic field coil 4 and a magnet 5, whereby a plasma 11 is generated. An etching chamber 7 is comprised of an etching gas inlet 8, an etching gas outlet 9 and a sample piece support 10. The generated plasma 11 moves along the mirror magnetic field, and reaches the sample piece 12, and the surface of sample piece 12 is etched.

Such micro-wave plasma etching apparatus has many features such as (1) since an electric discharge is possible in a low gas pressure range ($5 \times 10^{-2}$ Pa or less), ions can be oriented in a uniform direction, and finer processing can be made, (2) etching can be carried out in a wide gas pressure range, (3) a high density plasma can be generated, and (4) life of the apparatus is prolonged because of electrodeless electric discharge, and an activated gas can be used.

As is well known, a gas containing various Freons ($C_nF_m$), for example, $CF_4$ or $C_2F_4$, has been generally used as an electric discharge gas in etching single crystal silicon, polycrystal silicon, $SiO_2$, $Si_3N_4$, etc. by plasma etching. However, when silicon or silicon compounds are etched with the Freon as the electric discharge gas, there are still the following problems.

(1) The etching rate of silicon is low, and particularly when a gas pressure is low, the etching rate is extremely low. For example, the etching rate of silicon with $CF_4$ under a pressure of $7 \times 10^{-2}$ Pa is as low as 7 nm/min, and is not practical.

(2) A difference between the etching rate of silicon and the etching rate of silicon compounds such as $SiO_2$ or phosphorus glass is so small that it is practically difficult to selectively etch any one of silicon and silicon compounds. That is, it is difficult to form a concave part on a silicon substrate, for example, by using a mask consisting of $SiO_2$, and carrying out plasma etching with $CF_4$ or $C_2F_4$ as a reacting gas.

(3) It is difficult to detect an etching end point, and an accurate control of etching is difficult to make.

These problems can be all solved by using a microwave plasma etching apparatus as the etching apparatus, and using a gas containing at least $SF_6$ as the electric discharge gas. That is, when silicon is etched with $SF_6$ as the electric discharge gas, the etching rate will be at least 5 times as high as that obtained when $CF_4$ is used. For example, when $SF_6$ under a pressure of $7 \times 10^{-2}$ Pa is used, the etching rate of silicon is nearly 110 nm/min (substrate temperature 40° C.), which is almost 18 times as high as the etching rate when etching is carried out with $CF_4$ under the same conditions as above, and is a sufficiently practical value. On the other hand, the etching rate of $SiO_2$ with $SF_6$ is equal to that with $CF_4$.

Why the etching rate is low particularly when the pressure of $CF_4$ is low seems to be due to the fact that the carbon contained in $CF_4$ is deposited on the surface of the silicon substrate, and the deposited carbon gives an adverse effect upon the progress of etching, but in the case of $SF_6$, the etching proceeds rapidly, since it seems that no carbon atom is contained at all, and consequently no such adverse effect is given.

According to the present invention, the etching rate of silicon is very high, as described above, but the etching rates of $SiO_2$, phosphorus glass, photoresist film, etc. are very low, and thus the etching of silicon can be carried out by using $SiO_2$, photoresist film, etc. as a mask. That is, the etching rate of silicon when the etching is carried out with $SF_6$ under a pressure of $7 \times 10^{-2}$ Pa is 110 nm/min, but the etching rates of $SiO_2$ and photoresist film are 3.7 nm/min and 4 nm/min, respectively, which are almost 1/30 and 1/27 of that of silicon, respectively. That is, the etching of only silicon can be selectively carried out without any substantial etching of $SiO_2$ film or photoresist film. This is a very great advantage and great feature of the present invention.

Another great feature of the present invention is an easy detection of the etching end point and accurate control of etching. That is, when the etching of single crystal silicon, polycrystal silicon or amorphous silicon is carried out according to the present invention, a bluish green electric discharge light is emitted. On the other hand, no such bluish green electric discharge light is emitted when other compounds than silicon, for example, $SiO_2$, $Si_3N_4$ or photoresist film is etched.

The bluish green light emission when silicon is etched is very distinct, and can be readily detected by the naked eye. Though the mechanism of the bluish green light emission is not clarified yet, it seems that reaction products evaporate into the plasma, and the gas formed thereby is excited by the plasma, resulting in the light emission.

The bluish green light emission can be accurately detected even by the naked eye, as described above, but the detection of the bluish green light emission can be made much more accurately by a spectrophotometer. Thus, the etching end point can be detected, for example, in removing the polycrystal silicon film or $SiO_2$ film by etching, when the progress of reaction is monitored by means of the spectrophotometer, and a possibility of overetching can be eliminated thereby. Furthermore, a total amount of etched silicon, etc. can be determined from an integrated quantity of light measured by the spectrophotometer, and furthermore the depth of etching can be detected therefrom. For example, this can be applied to various fields such as isolation of the silicon substrate, etc. Furthermore, the intensity of bluish green light emission is proportional to the etching rate, and thus the etching state can be also determined from the value indicated by the spectrophotometer.

Various wavelengths corresponding to that of Si or SiF can be used as the wavelength for the measurement, and the etching end point detection, etc. can be made very effectively by monitoring the intensity of light emission of the desired wavelength within a range of 4,300–5,300 Å, by means of the spectrophotometer.

When silicon is etched by using a $SiO_2$ film or the like as a mask, a ratio in etching rate of silicon to mask is important, and practically the ratio of at least 10 is essential.

Figure 2:
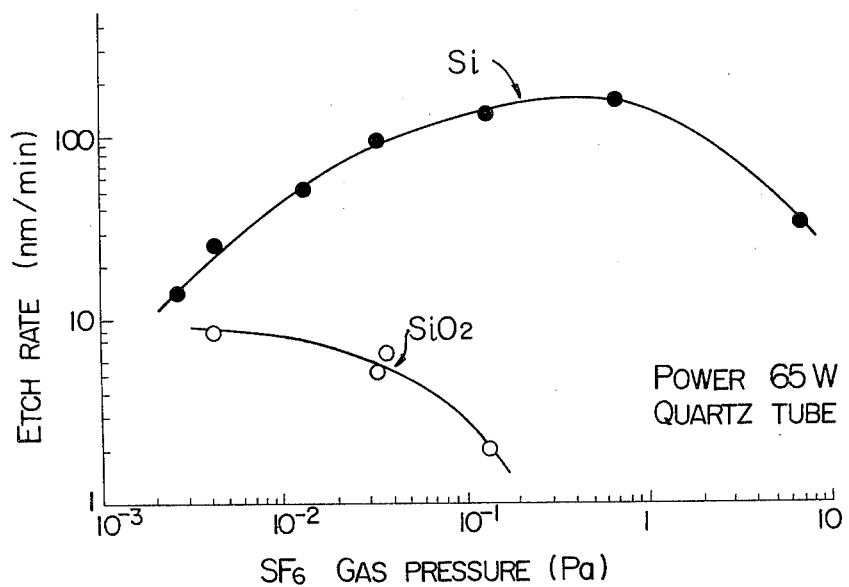
FIG. 2 and 3 are diagrams showing relations between a gas pressure and an etching rate when $SF_6$ and $CF_4$ are used as an etching gas, respectively.
Figure 3:
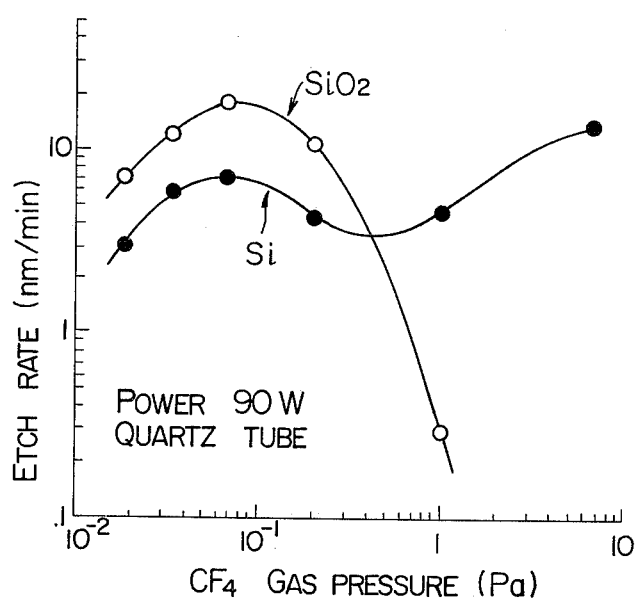

In FIGS. 2 and 3, relations between a gas pressure and an etching rate when Si and $SiO_2$ are etched with $SF_6$ and $CF_4$ as etching gases, respectively, are shown.

As is evident from FIG. 2, the etching rate of $SiO_2$ is rapidly lowered with increasing pressure of $SF_6$, whereas the etching rate of silicon is increased with increasing pressure of $SF_6$ until the gas pressure of $SF_6$ reaches about 1 Pa, and has a practically applicable etching rate at least up to about 10 Pa. As a result, the ratio in etching rate of silicon to $SiO_2$ is at least about 10, so long as the gas pressure of $SF_6$ is about $2 \times 10^{-2}$ Pa or higher, and the etching of silicon can be carried out without any trouble by using a $SiO_2$ film as the mask.

When $Si_3N_4$, phosphorus glass and photoresist film are investigated in the same manner as above in place of $SiO_2$, a ratio in rate of at least about 10 can be obtained, so long as the gas pressure of $SF_6$ is about $2 \times 10^{-2}$ Pa or higher, and the etching of silicon can be carried out without any trouble by using these materials as the mask.

However, when $CF_4$ is used as the etching gas, a gas pressure range for making the ratio in etching rate of silicon to $SiO_2$ at least 10 is at least 1 Pa, as is obvious from FIG. 3, but the undercut is considerable in that range, making the etching unpractical. That is, it is impossible without any undercut to make etching of silicon with $CF_4$ as the etching gas and a $SiO_2$ film as the mask.

As described above, a large selectivity (ratio in the etching rate) can be obtained by increasing the gas pressure of $SF_6$, and as the gas pressure of $SF_6$ is increased, the undercut will be gradually increased, and the cross-section of the undercut will take a trapezoidal shape. That is, no undercut appears at all if the gas pressure of $SF_6$ is not more than about $7 \times 10^{-2}$ Pa, but if the gas pressure of $SF_6$ is above $7 \times 10^{-2}$ Pa, the undercut gradually appears. Almost all of the resulting undercuts are practically negligible, but the appearance of undercuts can be effectively prevented by adding a gas capable of oxidizing or nitriding silicon or a gas capable of depositing carbon atoms on the surface of silicon, thereby reducing the etching rate of silicon, such as at least one of $O_2$, $NH_3$, $N_2$, $CF_4$, $CH_4$, etc. to $SF_6$.

Figure 4:
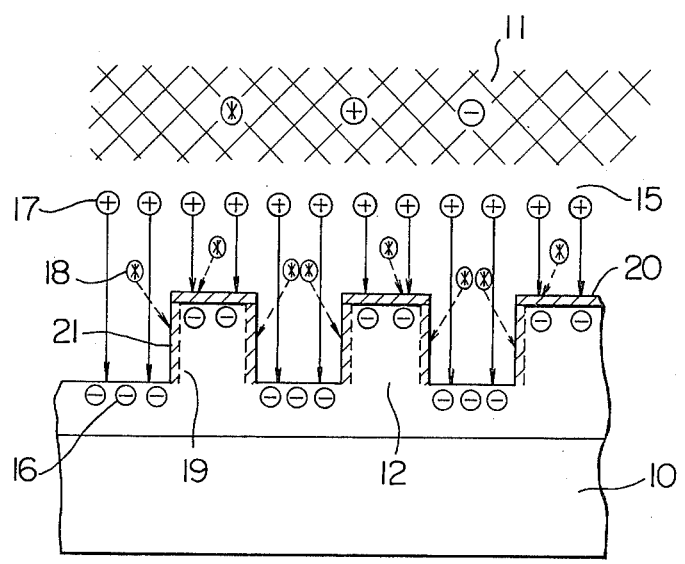
FIG. 4 is a schematic view explaining a control of undercut according to the present invention.

In FIG. 4, it is schematically shown that the appearance of undercuts can be prevented by adding $O_2$ to $SF_6$. When etching is carried out in the microwave plasma etching apparatus shown in FIG. 1, a silicon substrate 12 placed on the sample piece support 10 is coated with a mask 20 consisting of $SiO_2$, or the like.

Since $SF_6$ is admixed with $O_2$, a thin $SiO_2$ film is formed on the surface of Si substrate. When a plasma is formed in the mirror magnetic field, electrons impinge upon the etching gas, forming various ions or neutral radicals. For example, according to the following reaction, $$SF_6 + e \rightarrow SF_5^{+,*} + F^{+,*} + 3e$$

or $$SF_6 + e \rightarrow SF_4^{+,*} + 2F^{+,*} + 3e$$

excited neutral particles ($F^*$, $SF_n^*$), ions ($F^+$, $SF_n^+$) and electrons are formed.

Relations in potential between the substrate 12 in the plasma and the plasma are such that an equilibrium is established by equating quantities of incident currents of electrons and ions, and the plasma is made a floating potential. At that time, a zone having a potential gradient, which is called an ion sheath, is generated near the surface of the substrate 12. When ions 17 pass to the substrate 12 through the ion sheath zone from the plasma zone in the case of a low gas pressure, the ions can fall onto the substrate surface perpendicularly thereto without any impingement upon other particles, whereas the excited neutral particles 18 fall thereon at a random direction.

The etching reaction under a low gas pressure is to a great extent contributed by the ions. Ions 17 are accelerated through the ion sheath zone, and fall onto the surface of substrate 12, and thus the thin $SiO_2$ film on the parts not coated with the mask 20 is removed by etching, and the surface of Si substrate 12 is exposed thereby, and etched by the neutral particles 18 and the ions 17 at a high rate. However, all the ions 17 fall on the substrate 12 perpendicularly thereto, that is, they never fall on the side parts 21, and only the neutral particles 18 incapable of etching $SiO_2$ fall on the side parts 21.

Therefore, the side parts 21 are not etched even by continued etching, and no etching takes place in a longitudinal direction. That is, the appearance of undercuts can be effectively prevented.

According to the present invention, preferably about 3 to 20% by volume of $O_2$ is added to $SF_6$ on the basis of $SF_6$. If less than about 3% by volume of $O_2$ is added thereto, no substantial effect of preventing the appearance of undercuts is observed, whereas, if more than 20% by volume of $O_2$ is added thereto, the etching rate of Si is considerably lowered, and one of the features properly possessed by $SF_6$ is considerably lost. More preferably, about 10% by volume of $O_2$ is added to $SF_6$ on the basis of $SF_6$ in view of the etching rate of Si and the prevention of appearance of undercuts.

When other gases than $O_2$, for example, $CF_4$, etc. are used to prevent the appearance of undercuts, a mechanism of preventing the appearance of undercuts is naturally different from that with $O_2$, but addition of about 3 to 20% by volume of any of these compounds to $SF_6$ on the basis of $SF_6$ is very effective for preventing the appearance of undercuts in the same manner as with $O_2$.

When single crystal silicon or polycrystal silicon in etched not only using $SiO_2$ but also using $Si_3N_4$, phosphorus glass or photoresist film as a mask, similar effect can be obtained. That is, the present invention is very effective for these cases.

Figure 5:
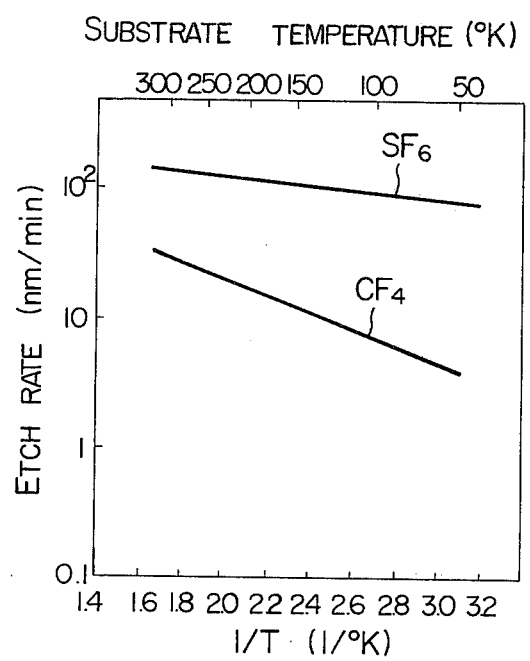
FIG. 5 is a diagram showing a dependency of etching rate upon temperature according to the present invention.

As is obvious from the foregoing description, the present invention has very remarkable effects such as a considerably high etching rate, a high selectivity, an exact monitoring of etching, easy operation due to a low temperature dependency of the etching rate shown in FIG. 5, etc., by using $SF_6$ as an etching gas in the micro-wave plasma etching, as compared with the conventional plasma etching process, and particularly a very great advantage can be obtained, when applied to the production of semi-conductor devices.

What is claimed is:

1. A process for plasma etching which comprises etching a material to be etched with a plasma in contact with said material, said plasma being formed by absorbing a micro-wave generated by a magnetron in an etching gas, said plasma being formed in a mirror magnetic field, formed by a magnetic field coil, at a position such that ions of said plasma can contact said material, wherein the etching gas contains at least $SF_6$.

2. A process according to claim 1, wherein a pressure of the $SF_6$ is $2 \times 10^{-2}$ Pa to 10 Pa.

3. A process according to claim 1 or 2, wherein said etching gas contains, in addition to $SF_6$, at least one gas selected from the group consisting of $O_2$, $N_2$, $NH_3$, $CF_4$ and $CH_4$.

4. A process according to claim 3, wherein the etching gas contains 3 to 20% by volume of said at least one gas on the basis of said $SF_6$.

5. A process according to claim 4, wherein the material to be etched is selected from the group consisting of single crystal silicon, polycrystal silicon and amorphous silicon.

6. A process according to claim 5, wherein the material to be etched is coated with a mask of $SiO_2$, $Si_3N_4$, phosphorus glass or photoresist film, whereby said plasma etches said material to be etched at a much faster rate than it etches the mask material.

7. A process according to claim 6, wherein the etching rate ratio of the material to be etched to the mask material is at least 10.

8. A process according to claim 5, wherein during the etching a bluish green light emission, emitted during the etching of said material, is monitored, whereby the end point of said etching, occurring when said bluish green light emission ceases, can be determined.

9. A process according to claim 8, wherein the emission is monitored by measuring a light emission intensity of desired wavelength within a range of 4,300 to 5,300 Å.

10. A process according to claim 4, wherein during the etching a bluish green light emission, emitted during the etching of said material, is monitored, whereby the end point of said etching, occurring when said bluish green light emission ceases, can be determined.

11. A process according to claim 10, wherein the emission is monitored by measuring a light emission intensity of desired wavelength within a range of 4,300 to 5,300 Å.

12. A process according to claim 3, wherein the material to be etched is selected from the group consisting of single crystal silicon, polycrystal silicon and amorphous silicon.

13. A process according to claim 12, wherein the material to be etched is coated with a mask of $SiO_2$, $Si_3N_4$, phosphorus glass or photoresist film, whereby said plasma etches said material to be etched at a much faster rate than it etches the mask material.

14. A process according to claim 13, wherein the etching rate ratio of the material to be etched to the mask material is at least 10.

15. A process according to claim 12, wherein during the etching a bluish green light emission, emitted during the etching of said material, is monitored whereby the end point of said etching, occurring when said bluish green light emission ceases, can be determined.

16. A process according to claim 15, wherein the emission is monitored by measuring a light emission intensity of desired wavelength within a range of 4,300 to 5,300 Å.

17. A process according to claim 3, wherein during the etching a bluish green light emission, emitted during the etching of said material, is monitored, whereby the end point of said etching, occurring when said bluish green light emission ceases, can be determined.

18. A process according to claim 17, wherein the emission is monitored by measuring a light emission intensity of desired wavelength within a range of 4,300 to 5,300 Å.

19. A process according to claim 1 or 2, wherein the material to be etched is selected from the group consisting of single crystal silicon, polycrystal silicon and amorphous silicon.

20. A process according to claim 19, wherein the material to be etched is coated with a mask of $SiO_2$, $Si_3N_4$, phosphorus glass or photoresist film, whereby said plasma etches said material to be etched at a much faster rate than it etches the mask material.

21. A process according to claim 20, wherein during the etching a bluish green light emission, emitted during the etching of said material, is monitored, whereby the end point of said etching, occurring when said bluish green light emission ceases, can be determined.

22. A process according to claim 21, wherein the emission is monitored by measuring a light emission intensity of desired wavelength within a range of 4,300 to 5,300 A.

23. A process according to claim 20, wherein the etching rate ratio of the material to be etched to the mask material is at least 10.

24. A process according to claim 19, wherein during the etching a bluish green light emission, emitted during the etching of said material, is monitored, whereby the end point of said etching, occurring when said bluish green light emission ceases, can be determined.

25. A process according to claim 24, wherein the emission is monitored by measuring a light emission intensity of desired wavelength within a range of 4,300 to 5,300 A.

26. A process according to claim 1 or 2, wherein during the etching a bluish green light emission, emitted during the etching of said material, is monitored, whereby the end point of said etching, occurring when said bluish green light emission ceases, can be determined.

27. A process according to claim 26, wherein the emission is monitored by measuring a light emission intensity of desired wavelength within a range of 4,300 to 5,300 A.

28. A process for plasma etching which comprises etching a material to be etched with a plasma in contact with said material, said plasma being formed by absorbing a microwave generated by a magnetron in an etching gas, said plasma being formed in a mirror magnetic field, formed by a magnetic field coil and an additional magnet, at a position such that ions of said plasma can contact said material, wherein the etching gas contains at least $SF_6$.

* * * * *

UNITED STATES PATENT AND TRADEMARK OFFICE
CERTIFICATE OF CORRECTION

PATENT NO. : 4,330,384
DATED : May 18, 1982
INVENTOR(S) : SADAYUKI OKUDAIRA ET AL

It is certified that error appears in the above-identified patent and that said Letters Patent are hereby corrected as shown below:

In the first column on the first page, under the heading "[30] FOREIGN APPLICATION PRIORITY DATA", please make the following change:

In line 2 of the Foreign Application Priority Data, please delete "53-164644" and insert therefor --53-164644[U]--.

Signed and Sealed this

Twenty-seventh Day of September 1983

[SEAL]

Attest:

Attesting Officer

GERALD J. MOSSINGHOFF

Commissioner of Patents and Trademarks